(12) United States Patent
Lim

(10) Patent No.: US 9,831,862 B2
(45) Date of Patent: Nov. 28, 2017

(54) DUTY CYCLE CORRECTION CIRCUIT AND IMAGE SENSING DEVICE INCLUDING THE SAME

(71) Applicant: SK hynix Inc., Gyeonggi-do (KR)

(72) Inventor: Sung-Chan Lim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 113 days.

(21) Appl. No.: 14/800,392

(22) Filed: Jul. 15, 2015

(65) Prior Publication Data

US 2016/0269013 A1 Sep. 15, 2016

(30) Foreign Application Priority Data

Mar. 9, 2015 (KR) .......................... 10-2015-0032649

(51) Int. Cl.
*H03K 4/04* (2006.01)
*H03K 5/156* (2006.01)
*H04N 5/378* (2011.01)

(52) U.S. Cl.
CPC ........... *H03K 5/1565* (2013.01); *H04N 5/378* (2013.01)

(58) Field of Classification Search
CPC .............................. H03K 5/1565; H03K 3/017
USPC ........................................................... 327/175
See application file for complete search history.

(56) References Cited

U.S. PATENT DOCUMENTS

2004/0189364 A1* 9/2004 Lee ....................... H03K 5/1565
327/175
2010/0073057 A1* 3/2010 Ku ......................... H03K 3/017
327/175

FOREIGN PATENT DOCUMENTS

KR 1020090034762 4/2009
KR 1020110133781 12/2011

* cited by examiner

*Primary Examiner* — Thanh Luu

(74) *Attorney, Agent, or Firm* — IP & T Group LLP

(57) ABSTRACT

A duty cycle correction circuit includes a detection block suitable for detecting a duty cycle of a first clock in response to the first clock and a second clock, and a correction block suitable for generating a first corrected clock having a corrected duty cycle relative to the first clock and a second corrected clock having a corrected duty cycle relative to the second clock, based on a detection result of the detection block.

6 Claims, 4 Drawing Sheets

| CLKP | CLKN | S | R | Sb | Rb | OUTP | OUTN |
|------|------|---|---|----|----|------|------|
| 0 | 0 | 1 | 1 | 0 | 0 | LATCH | LATCH |
| 0 | 1 | 1 | 0 | 0 | 1 | 0 | 1 |
| 1 | 0 | 0 | 1 | 1 | 0 | 1 | 0 |
| 1 | 1 | 1 | 1 | 0 | 0 | LATCH | LATCH |

DUTY CYCLE CORRECTION CIRCUIT AND IMAGE SENSING DEVICE INCLUDING THE SAME

CROSS-REFERENCE TO RELATED APPLICATIONS

The present application claims priority of Korean Patent Application No. 10-2015-0032649, filed on Mar. 9, 2015, which is incorporated herein by reference in its entirety.

BACKGROUND

1. Field

Exemplary embodiments of the present invention relate to a semiconductor design technology, and more particularly, to a duty cycle correction circuit and an image sensing device including the duty cycle correction circuit.

2. Description of the Related Art

Semiconductor devices use clocks to perform operations at specific times. For example, a semiconductor device may perform an operation based on one or both of the rising and falling edges of a clock.

Efforts to correct clock duty cycles have been made to improve operation margin and high-speed operation. The duty cycle of the clock is the ratio of the logic low level duration to the logic high level duration. It is important to precisely control the duty cycle of the clock to be 50:50 so that valid window regions of signals and data are secured. Clock duty cycle is an important factor in determining the performance of the semiconductor device.

Accordingly, semiconductor devices include a duty cycle correction circuit for correcting clock duty cycles. For example, a duty cycle correction circuit may correct the duty cycle of a clock outputted from a delay locked loop (DLL) a phase locked loop (PLL), a rising voltage controlled oscillator (VCO) and so on included in the semiconductor device at a ratio of 50 to 50. The corrected clock having a duty cycle of 50:50 becomes the basis for stable circuit operations.

However, duty cycle correction circuits generally require a large amount of circuit area, have complicated structures, and have high current consumption.

A semiconductor device may also include an image sensing device, and the image sensing device may include a duty cycle correction circuit for using a double data rate (DDR) scheme. For example the image sending device may perform a counting operation based on the DDR scheme using a clock for converting a pixel signal outputted from a pixel into a digital signal. In order to properly perform the counting operation based on the DDR scheme, it is important to use a clock having a duty cycle of 50 to 50.

An image sensing device captures images using the photosensitive properties of semiconductors. Image sensing devices may be classified into charge coupled device (CCD) image sensors and complementary metal oxide semiconductor (CMOS) image sensors. CMOS image sensors have come into widespread use. This is because CMOS image sensors allow analog circuits and digital control circuits to be directly implemented on a single integrated circuit (IC).

SUMMARY

Exemplary embodiments of the present invention are directed to a duty cycle correction circuit that may correct duty cycles of a first clock and a second clock which is phase-shifted by approximately 180 degrees from the first clock, and an image sensing device including the duty cycle correction circuit.

In accordance with an embodiment of the present invention, a duty cycle correction circuit includes a detection block suitable for detecting a duty cycle of a first clock in response to the first clock and a second clock, and a correction block suitable for generating a first corrected clock having a corrected duty cycle relative to the first clock and a second corrected clock having a corrected duty cycle relative to the second clock, based on a detection result of the detection block.

The second clock may be delayed in phase by approximately 180 degrees from the first clock.

The detection block may detect the duty cycle of the first clock based on a logic state of the first clock and a logic state of the second clock.

In accordance with another embodiment of the present invention, a duty cycle correction circuit includes a first logic combination unit suitable for generating a first corrected signal and a second corrected signal corresponding to a duty cycle of a first clock and a duty cycle of a second clock based on a logic state of the first clock and a logic state of a second clock, a second logic combination unit suitable for generating a third corrected signal and a fourth corrected signal in response to the first corrected signal and the second corrected signal, a first phase correction unit suitable for generating a first corrected clock having a corrected duty cycle relative to the first clock and a second corrected clock having a corrected duty cycle relative to the second clock, in response to the first to fourth corrected signals, and a second phase correction unit suitable for maintaining a logic state of the first corrected clock and a logic state of the second corrected clock.

The second clock may be delayed in phase by approximately 180 degrees from the first clock.

The first logic combination unit may recombine the logic state of the first clock and the logic state of the second clock and generate the first corrected signal and the second corrected signal in a predetermined logic combination.

The first logic combination unit may generate the first and second corrected signals at a first logic state when the logic states of the first and second clocks are the same, while generate the first and second corrected signals at different logic states when the logic states of the first and second clocks are different.

The second logic combination unit may generate the third corrected signal which is in an inversion relationship with the first corrected signal and the fourth corrected signal which is in an inversion relationship with the second corrected signal.

The first phase correction unit may generate the first corrected clock and the second corrected clock which are in an inversion relationship with each other in response to the first to fourth corrected signals.

The first phase correction unit may include a first driver suitable for driving an output terminal of the first corrected clock with a high voltage in response to the first corrected signal, a second driver suitable for driving the output terminal of the first corrected clock with a low voltage in response to the fourth corrected signal, a third driver suitable for driving an output terminal of the second corrected clock with the high voltage in response to the second corrected signal, and a fourth driver suitable for driving the output terminal of the second corrected clock with the low voltage in response to the third corrected signal.

The second phase correction unit may include a latch coupled between the output terminal of the first corrected clock and the output terminal of the second corrected clock.

In accordance with another embodiment of the present invention, an image sensing device includes a duty cycle correction circuit suitable for generating first and second corrected clocks having corrected duty cycles relative to first and second clocks respectively, based on a logic relationship between the first clock and the second clock, wherein the second clock is shifted in phase from the first clock, a controller suitable for generating an operation control signal, a pixel array suitable for generating a pixel signal in response to the operation control signal, and an analog-to-digital converter suitable for converting the pixel signal into a digital signal in response to the first corrected clock and the second corrected clock.

The first clock and the second clock may be generated based on a source clock, and the second clock may be phase-shifted by approximately 180 degrees from the first clock.

The duty cycle correction circuit may include a detection block suitable for detecting the duty cycle of the first clock in response to the first clock and the second clock, and a correction block suitable for generating the first corrected clock and the second corrected clock based on a detection result of the detection block.

The detection block may include a first logic combination unit suitable for generating a first corrected signal and a second corrected signal corresponding to the duty cycles of the first and second clocks based on a logic state of the first clock and a logic state of the second clock, and a second logic combination unit suitable for generating a third corrected signal and a fourth corrected signal in response to the first corrected signal and the second corrected signal.

The first logic combination unit may recombine the logic state of the first clock and the logic state of the second clock and generate the first corrected signal and the second corrected signal in a predetermined logic combination.

The first logic combination unit may generate the first and second corrected signals at a first logic state when the logic states of the first and second clocks are the same, while generate the first and second corrected signals at different logic states when the logic states of the first and second clocks are different.

The second logic combination unit may generate the third corrected signal which is in an inversion relationship with the first corrected signal and the fourth corrected signal which is in an inversion relationship with the second corrected signal.

The correction block may include a first phase correction unit suitable for generating the first corrected clock and the second corrected clock in response to the first to fourth corrected signals, and a second phase correction unit suitable for maintaining a logic state of the first corrected clock and a logic state of the second corrected clock.

The first phase correction unit may generate the first corrected clock and the second corrected clock which are in an inversion relationship with each other in response to the first to fourth corrected signals.

The first phase correction unit may include a first driver suitable for driving an output terminal of the first corrected clock with a high voltage in response to the first corrected signal, a second driver suitable for driving the output terminal of the first corrected clock with a low voltage in response to the fourth corrected signal, a third driver suitable for driving an output terminal of the second corrected clock with the high voltage in response to the second corrected signal, and a fourth driver suitable for driving the output terminal of the second corrected clock with the low voltage in response to the third corrected signal.

DETAILED DESCRIPTION

Exemplary embodiments of the present invention are described below in more detail with reference to the accompanying drawings. These embodiments are provided so that this disclosure is thorough and complete, and fully conveys the scope of the present invention to those skilled in the art. All "embodiments" referred to in this disclosure refer to embodiments of the inventive concept disclosed herein. The embodiments presented are merely examples and are not intended to limit the inventive concept.

It is also noted that in this specification, "connected/coupled" refers to one component not only directly coupling another component but also indirectly coupling another component through an intermediate component. In addition, the singular form may include the plural form as long as it is not specifically mentioned otherwise.

Figure 1:
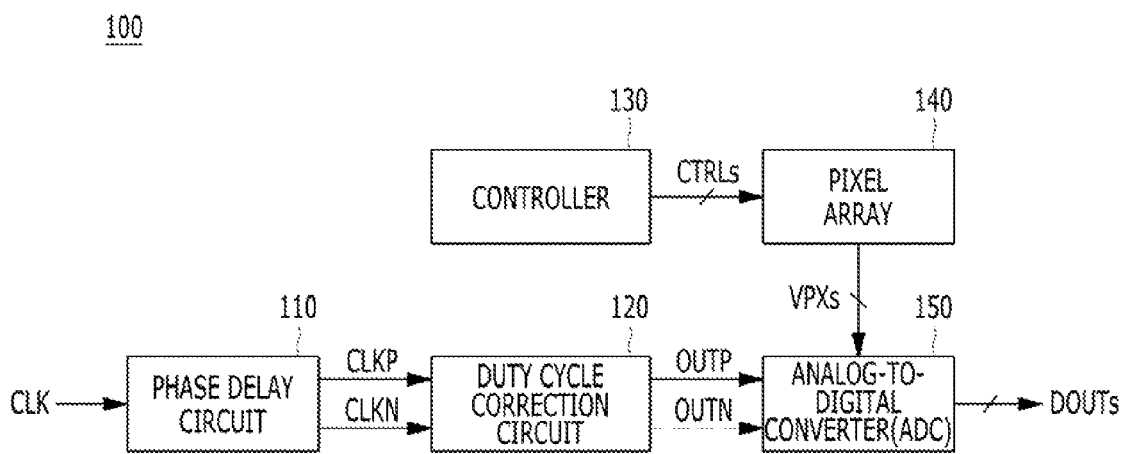
FIG. 1 is a block diagram illustrating an image sensing device in accordance with an embodiment of the present invention.

FIG. 1 is a block diagram illustrating an image sensing device in accordance with an embodiment of the present invention.

Referring to FIG. 1, an image sensing device 100 may include a phase delay circuit 110, a duty cycle correction circuit 120, a controller 130, a pixel array 140, and an analog-to-digital converter 150.

The phase delay circuit 110 may generate a first clock CLKP and a second clock CLKN in response to a source clock CLK. For example, the phase delay circuit 110 may generate the first clock CLKP having the same phase as the source clock CLK and the second clock CLKN which is phase-shifted by approximately 180 degrees from the source clock CLK or the first clock CLKP.

Although not illustrated in the drawing, the source clock CLK may be outputted from a clock generation circuit such as a phase locked loop (PLL). The source clock CLK may be distorted due to defects in the clock generation circuit or loads in its transmission fine. Accordingly, the first and second clock CLKP and CLKN may not have required duty cycles therebetween.

The duty cycle correction circuit 120 may generate a first corrected clock OUTP having a corrected duty cycle relative to the first clock CLKP and a second corrected clock OUTN having a corrected duty cycle relative to the second clock CLKN, based on a logic relationship between the first clock CLKP and the second clock CLKN.

The controller 130 may generate a plurality of operation control signals CTRLs. For example, the operation control signals CTRLs may include transmission signals, reset signals, and selection signals for each row of the pixel array 140 in order to control the operation of each row of the pixel array 140.

The pixel array 140 may include a plurality of pixels (not shown in the drawing) arranged in rows and columns. The pixels may generate a plurality of pixel signals VPXs on a row-by-row basis in response to the operation control signals CTRLs.

The analog-to-digital converter 150 may convert the pixel signals VPXs into a plurality of digital signals DOUTs based on the first corrected clock OUTP and the second corrected clock OUTN. Or, the analog-to-digital converter 150 may convert the pixel signals VPXs into the digital signals DOUTs based on just the first corrected clock OUTP. For example, the analog-to-digital converter 150 may perform a counting operation based on a DDR scheme in response to at least one among the first corrected clock OUTP and the second corrected clock OUTN, thereby converting the pixel signals VPXs into the digital signals DOUTs.

Although not illustrated in FIG. 1, the image sensing device 100 may further include a clock conversion circuit. For example, the clock conversion circuit may divide the first corrected clock OUTP and the second corrected clock OUTN at a predetermined division ratio and supply a first divided clock and a second divided clock to the analog-to-digital converter 150. The analog-to-digital converter 150 may use at least one among the first divided clock and the second divided clock in lieu of the first corrected clock OUTP and the second corrected clock OUTN.

Figure 2:
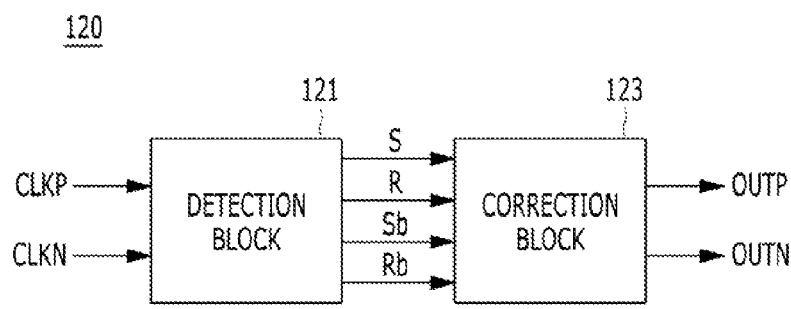
FIG. 2 is a block diagram illustrating a duty cycle correction circuit shown in FIG. 1.

FIG. 2 is a block diagram illustrating the duty cycle correction circuit 120 shown in FIG. 1.

Referring to FIG. 2, the duty cycle correction circuit 120 may include a detection block 121 and a correction block 123.

The detection block 121 may detect a duty cycle of the first clock CLKP and the second clock CLKN. For example, the detection block 121 may generate first to fourth corrected signals S, R, Sb and Rb corresponding to the duty cycle based on logic states of the first clock CLKP and the second clock CLKN.

The correction block 123 may generate the first corrected clock OUTP having a corrected duty cycle relative to the first clock CLKP and the second corrected clock OUTN having a corrected duty cycle relative to the second clock CLKN, based on a detection result of the detection block 121. For example, the correction block 123 may generate the first corrected clock OUTP in response to the first corrected signal S and the fourth corrected signal Rb and the second corrected clock OUTN in response to the second corrected signal R and the third corrected signal Sb.

Figure 3:
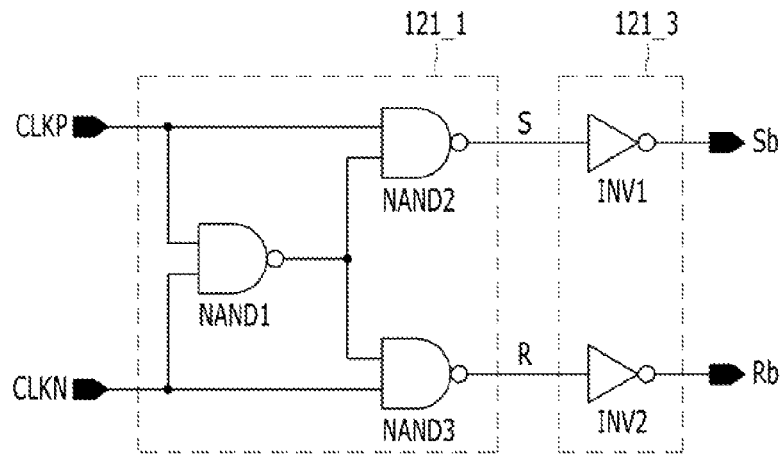
FIG. 3 is a circuit diagram illustrating a detection block shown in FIG. 2.

FIG. 3 is a circuit diagram illustrating the detection block 121 shorn in FIG. 2.

Referring to FIG. 3, the detection block 121 may include a first logic combination unit 121_1 and a second logic combination unit 121_3.

The first logic combination unit 121_1 may generate the first and second corrected signals S and R corresponding to the duty cycles of the first clock CLKP and the second clock CLKN based on a logic state of the first clock CLKP and a logic state of the second clock CLKN. In other words, the first logic combination unit 121_1 may recombine the logic state of the first clock CLKP and the logic state of the second clock CLKN and generate the first and second corrected signals S and R in predetermined logic combination. For example, the first logic combination unit 121_1 may include first to third NAND gates NAND1 to NAND3. The first NAND gate NAND1 may perform a NAND operation on the first clock CLKP and the second clock CLKN. The second NAND gate NAND2 may perform the NAND operation on the first clock CLKP and an output of the first NAND gate NAND1 and generate the first corrected signal S. The third NAND gate NAND3 may perform the NAND operation on the second clock CLKN and the output of the first NAND gate NAND1 and generate the second corrected signal R.

The second logic combination unit 121_3 may generate the third and fourth corrected signals Sb and Rb corresponding to the duty cycles of the first clock CLKP and the second clock CLKN in response to the first corrected signal S and the second corrected signal R. In other words, the second logic combination unit 121_3 may generate the third corrected signal Sb which is in an inversion relationship with the first corrected signal S and the fourth corrected signal Rb which is in an inversion relationship with the second corrected signal R. For example, the second logic combination unit 121_3 may include a first inverter INV1 for inverting the first corrected signal S and generating the third corrected signal Sb and a second inverter INV2 for inverting the second corrected signal R and generating the fourth corrected signal Rb. Hereinafter, the third corrected signal Sb is referred to as a first corrected inversion signal Sb, and the fourth corrected signal Rb is referred to as a second corrected inversion signal Rb.

Figure 4:
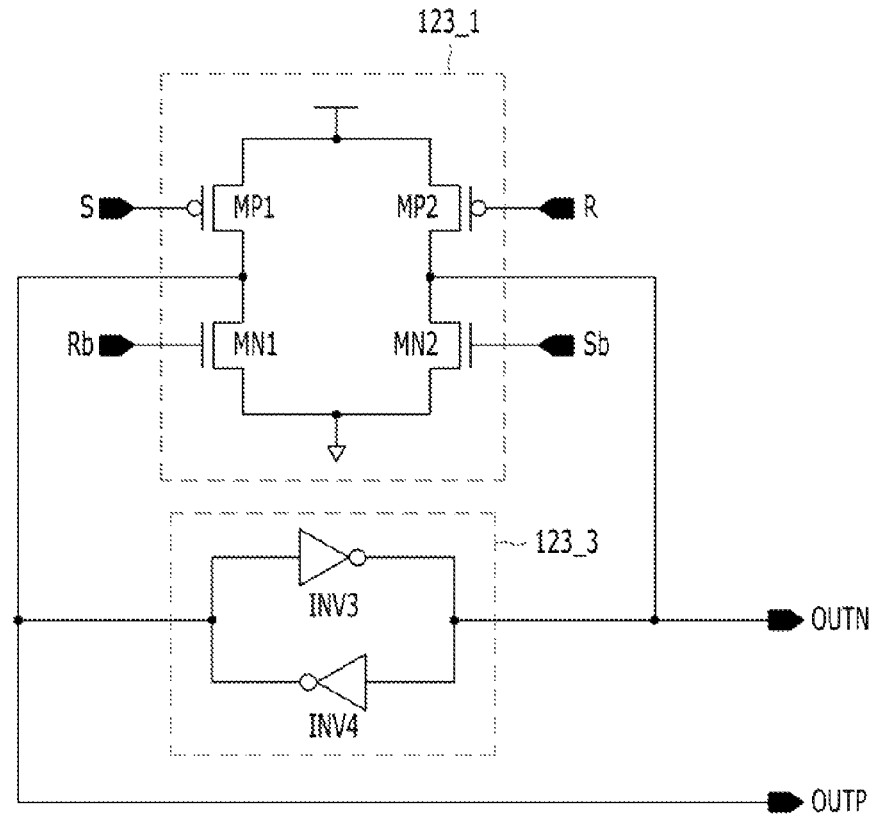
FIG. 4 is a circuit diagram illustrating a correction block shown in FIG. 2.

FIG. 4 is a circuit diagram illustrating the correction block 123 shown in FIG. 2.

Referring to FIG. 4, the correction block 123 may include a first phase correction unit 123_1 and a second phase correction unit 123_3.

The first phase correction unit 123_1 may generate the first corrected clock OUTP and the second corrected clock OUTN having a corrected duty cycles relative to the first clock CLKP and the second clock CLKN, respectively, in response to the first corrected signal S, the second corrected signal R, and the first corrected inversion signal Sb and the second corrected inversion signal Rb. In other words, the first phase correction unit 123_1 may generate the first corrected clock OUTP and the second corrected clock OUTN, which are in inversion relationships with each other, in response to the first corrected signal S, the second corrected signal R, and the first corrected inversion signal Sb and the second corrected inversion signal Rb. For example, the first phase correction unit 123_1 may include first to fourth drivers MP1, MN1, MP2, and MN2. The first driver MP1 may drive an output terminal of the first corrected clock OUTP with a high voltage in response to the first corrected signal S, The second driver MN1 may drive the output terminal of the first corrected clock OUTP with a low voltage in response to the second corrected inversion signal Rb. The third driver MP2 may drive an output terminal of the second corrected clock OUTN with the high voltage in response to the second corrected signal R. The fourth driver MN2 may drive the output terminal of the second corrected clock OUTN with the low voltage in response to the first corrected inversion signal Sb.

The second phase correction unit 123_3 may maintain the logic states of the first corrected clock OUTP and the second corrected clock OUTN. For example, the second phase correction unit 123_3 may include a latch INV3 and INV4 that is coupled between the output terminal of the first corrected clock OUTP and the output terminal of the second corrected clock OUTN.

Hereinafter, an operation of the image sensing device 100 having the aforementioned structure in accordance with the embodiment of the present invention is described.

Figure 5:
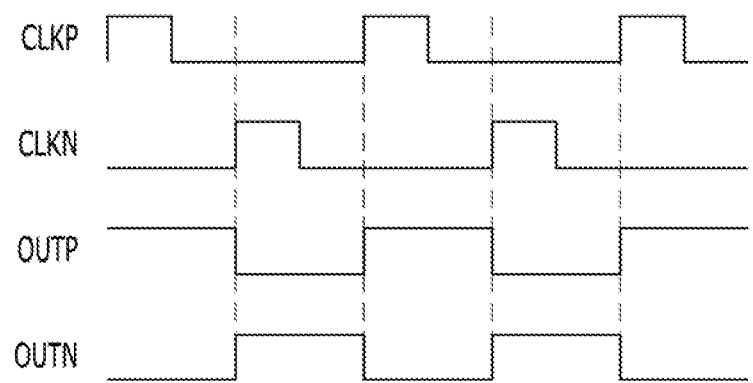
FIG. 5 is a timing diagram for describing an operation of the duty cycle correction circuit based on a first example shown in FIG. 1.
Figures 6, 7:
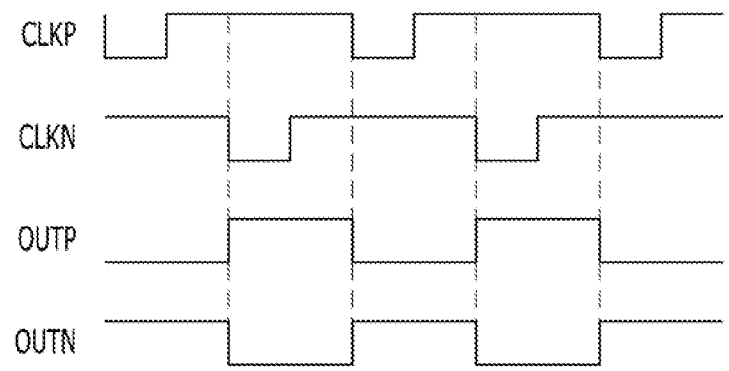
FIG. 6 is a timing diagram for describing an operation of the duty cycle correction circuit based on a second example shown in FIG. 1.
FIG. 7 is a truth table for describing an operation of the duty cycle correction circuit shown in FIG. 1.

FIG. 5 is a timing diagram for describing an operation of the duty cycle correction circuit 120 included in the image sensing device 100 based on a first example. FIG. 6 is a timing diagram for describing an operation of the duty cycle correction circuit 120 included in the image sensing device 100 based on a second example. FIG. 7 is a truth table for describing the operation of the duty cycle correction circuit 120.

Referring to FIGS. 5 and 7, the duty cycle correction circuit 120 may generate the first corrected clock OUTP having a corrected duty cycle relative to the first clock CLKP and the second corrected clock OUTN having a corrected duty cycle relative to the second clock CLKN, based on logic relationships between the first clock CLKP and the second clock CLKN. The operation of the duty cycle correction circuit 120 is described below in detail.

The detection block 121 may generate the first corrected signal S, the second corrected signal R, the first corrected inversion signal Sb, and the second corrected inversion signal Rb based on the logic relationships between the first clock CLKP and the second clock CLKN.

For example, the detection block 121 may determine the logic states of the first corrected signal S, the second corrected signal R, the first corrected inversion signal Sb, and the second corrected inversion signal Rb based on whether the logic state of the first clock CLKP and the logic state of the second clock CLKN are in an inverted relationship.

When the logic state of the first clock CLKP and the login state of the second clock CLKN are "0" and "1", respectively, the logic states of the first corrected signal S, the second corrected signal R, the first corrected inversion signal Sb, and the second corrected inversion signal Rb may be "1", "0", "0" and "1", respectively. When the logic state of the first clock CLKP and the logic state of the second clock CLKN are "1" and "0", respectively, the logic states of the first corrected signal S, the second corrected signal R, the first corrected inversion signal Sb, and the second corrected inversion signal Rb may be "0", "1", "1" and "0", respectively. When the logic state of the first clock CLKP and the logic state of the second clock CLKN are "0" and "0", respectively, the logic states of the first corrected signal S, the second corrected signal R, the first corrected inversion signal Sb, and the second corrected inversion signal Rb may be "1", "1", "0" and "0", respectively.

Ideally, the duty cycle of the first clock CLKP should be 50:50, and the duty cycle of the second clock CLKN should be 50:50. Then, since there is a phase difference of approximately 180 degrees between the first clock CLKP and the second clock CLKN, the logic state of the first clock CLKP and the logic state of the second clock CLKN have to be in inversion relationships with each other. Since the duty cycle of the first clock CLKP is not 50:50, and the duty cycle of the second clock CLKN is not 50:50 in actuality, the first clock. CLKP and the second clock CLKN may have the same logic state for a certain section. Therefore, when the section where the logic state of the first clock CLKP and the logic state of the second clock CLKN are in the non-inversion relationship may be detected, it may be seen that the duty cycles of the first clock CLKP and the second clock CLKN deteriorate (i.e., they are not maintained at the ratio of 50:50).

Subsequently, the correction block 123 may generate the first corrected clock OUTP whose duty cycle is corrected as compared with the first clock CLKP and the second corrected clock OUTN whose duty cycle is corrected as compared with the second clock CLKN, in response to the first corrected signal S, the second corrected signal R, the first corrected inversion signal Sb, and the second corrected inversion signal Rb.

For example, the correction block 123 may generate the first corrected clock OUTP in response to the first corrected signal S and the second corrected inversion signal Rb and the second corrected clock OUTN in response to the second corrected signal R and the first corrected inversion signal Sb.

When the logic states of the first corrected signal S, the second corrected signal R, the first corrected inversion signal Sb, and the second corrected inversion signal Rb are "1", "0", "0" and "1", respectively, the logic states of the first corrected clock OUTP and the second corrected clock OUTN may be "0" and "1", respectively. The second driver MN1 and the third driver MP2 among the first driver MP1, the second driver MN1, the third driver MP2 and the fourth driver MN2 may be turned on, and the logic states of the first corrected clock OUTP and the second corrected clock OUTN may become "0" and "1", respectively. The first corrected clock OUTP and the second corrected clock OUTN may maintain the current logic states, "0" and "1", based on the latch INV3 and INV4. When the logic states of the first corrected signal S, the second corrected signal R, the first corrected inversion signal Sb, and the second corrected inversion signal Rb are "0", "1", "1" and "0", respectively, the logic states of the first corrected clock OUTP and the second corrected clock OUTN may be "1" and "0", respectively. The first driver MP1 and the fourth driver MN2 may be turned on, and the logic states of the first corrected clock OUTP and the second corrected clock OUTN may become "1" and "0", respectively. The first corrected clock OUTP and the second corrected clock OUTN may maintain the current logic states, i.e., "1" and "0", based on the latch INV3 and INV4.

When the logic states of the first corrected signal S, the second corrected signal R, the first inverted corrected signal Sb, and the second inverted corrected signal Rb are "1", "1", "0" and "0", respectively, the first corrected clock OUTP and the second corrected clock OUTN may maintain previous logic states. The first driver MP1, the second driver MN1 and the fourth driver MN2 may be turned off, and the first corrected clock OUTP and the second corrected clock OUTN may maintain the previous logic states, i.e., "1" and "0" or "0" and "1", based on the latch INV3 and INV4.

Referring to FIGS. 6 and 7, the duty cycle correction circuit 120 may generate the first corrected clock OUTP whose duty cycle is corrected as compared with the first clock CLKP and the second corrected clock OUTN whose duty cycle is corrected as compared with the second clock CLKN, based on the logic relationships between the first clock CLKP and the second clock CLKN. The operation of the duty cycle correction circuit 120 is described below in detail.

The detection block 121 may generate the first corrected signal S, the second corrected signal R, the first corrected inversion signal Sb, and the second corrected inversion signal Rb based on the logic relationships between the first clock CLKP and the second clock CLKN.

For example, the detection block 121 may determine the logic states of the first corrected signal S, the second corrected signal R, the first corrected inversion signal Sb, and the second corrected inversion signal Rb based on whether the logic state of the first clock CLKP and the logic state of the second clock CLKN are in inversion relationships with each other.

When the logic state of the first clock CLKP and the logic state of the second clock CLKN are "0" and "1" respectively, the logic states of the first corrected signal S, the second corrected signal R, the first corrected inversion signal Sb, and the second corrected inversion signal Rb may be "1", "0", "0" and "1", respectively. When the logic state of the first clock CLKP and the logic state of the second clock CLKN are "1" and "0", respectively, the logic states of the first corrected signal S, the second corrected signal R, the first corrected inversion signal Sb, and the second corrected inversion signal Rb may be "0", "1", "1" and "0", respectively. When the logic state of the first clock CLKP and the logic state of the second clock CLKN are "1" and "1", respectively, the logic states of the first corrected signal S, the second corrected signal R, the first corrected inversion signal Sb, and the second corrected inversion signal Rb may be "1", "1", "0" and "0", respectively.

Ideally, the duty cycle of the first clock CLKP should be 50:50, and the duty cycle of the second clock CLKN should be 50:50. Then, since there is a phase difference of approximately 180 degrees between the first clock CLKP and the second clock CLKN, the logic state of the first clock CLKP and the logic state of the second clock CLKN have to be in inversion relationships with each other at all times. Since the duty cycle of the first clock CLKP is not 50:50, and the duty cycle of the second clock CLKN is not 50:50 in actuality, the first clock CLKP and the second clock CLKN may have the same logic state for a certain section. Therefore, when the section where the logic state of the first clock CLKP and the logic state of the second clock CLKN are in a non-inversion relationship may be detected, it may be seen that the duty cycles of the first clock. CLKP and the second clock CLKN deteriorate.

Subsequently, the correction block 123 may generate the first corrected clock OUTP whose duty cycle is corrected as compared with the first clock CLKP and the second corrected clock OUTN whose duty cycle is corrected as compared with the second clock CLKN, in response to the first corrected signal S, the second corrected signal R, the first corrected inversion signal Sb, and the second corrected inversion signal Rb.

For example, the correction block 123 may generate the first corrected clock OUTP in response to the first corrected signal S and the second corrected inversion signal Rb and the second corrected clock OUTN in response to the second corrected signal R and the first corrected inversion signal Sb.

When the logic states of the first corrected signal S, the second corrected signal R, the first corrected inversion signal Sb, and the second corrected inversion signal Rb are "1" "0", "0" and "1", respectively, the logic states of the first corrected clock OUTP and the second corrected clock OUTN may be "0" and "1", respectively. The second driver MN1 and the third driver MP2 may be turned on, and the logic states of the first corrected clock OUTP and the second corrected clock OUTN may become "0" and "1", respectively. The first corrected clock OUTP and the second corrected clock OUTN may maintain the current logic states, i.e., "0" and "1", based on the latch INV3 and INV4. When the logic states of the first corrected signal S, the second corrected signal R, the first corrected inversion signal Sb, and the second corrected inversion signal Rb are "0" "1" and "0", respectively, the logic states of the first corrected clock OUTP and the second corrected clock OUTN may be "1" and "0", respectively. The first driver MP1 and the fourth driver MN2 may be turned on, and the logic states of the first corrected clock OUTP and the second corrected clock OUTN may become "1" and "0", respectively. The first corrected clock OUTP and the second corrected clock OUTN may maintain the current logic states, i.e., "1" and "0", based on the latch INV3 and INV4.

When the logic states of the first corrected signal S, the second corrected signal R, the first inverted corrected signal Sb, and the second inverted corrected signal Rb are "1", "1", "0" and "0", respectively, the first corrected clock OUTP and the second corrected clock OUTN may maintain previous logic states. The first driver MP1, the second driver MN1, the third driver MP2 and the fourth driver MN2 may be turned off, and the first corrected clock OUTP and the second corrected clock OUTN may maintain the previous logic states, i.e., "0" and "1" or "1" and "0", based on the latch INV3 and INV4.

Under these circumstances, when the controller 130 generates the operation control signals CTRLs, the pixel array 140 may generate the pixel signals VPXs on a basis of a row.

The analog-to-digital converter 150 may count the pixel signals VPXs and convert the pixel signals VPXs into digital signals DOUTs. For example, the analog-to-digital converter 150 may perform a counting operation based on the DDR scheme using at least one among the first corrected clock OUTP and the second corrected clock OUTN.

In accordance with the embodiments of the present invention, a clock whose duty cycle is corrected may be generated based on a simple circuit. Also, a stable counting operation may be performed based on the corrected clock.

Furthermore, in accordance with the embodiments of the present invention, the duty cycle of a first clock and the duty cycle of a second clock that is phase-shifted by approximately 180 degrees from the first clock may be corrected based on a simple circuit. Accordingly, the size of an area occupied by a duty cycle correction circuit may be minimized.

Furthermore, in accordance with the embodiments of the present invention, the operation reliability may be improved based on the corrected clock.

While the present invention has been described with respect to specific embodiments, the embodiments are not intended to be restrictive, but rather descriptive. Further, it is noted that the present invention may be achieved in various ways through substitution, change, and modification, by those skilled in the art without departing from the scope of the present invention as defined by the following claims.

For example, although it is described in the embodiments of the present invention that an analog-to-digital converter (ADC) uses a corrected clock, the inventive concept is not limited to this, and the present invention may be applicable to other circuits using a clock such as an interface circuit.

Also, although an image sensing device is described in the embodiments of the present invention, the inventive concept is not limited to this, and the present invention may be applicable to other devices that use a clock.

What is claimed is:
1. A duty cycle correction circuit, comprising:
   a detection block suitable for detecting a duty cycle of a first clock in response to the first clock and a second clock; and a correction block suitable for generating a first corrected clock having a corrected duty cycle relative to the first clock and a second corrected clock having a corrected duty cycle relative to the second clock, based on a detection result of the detection block, wherein the detection block includes:

a first logic combination unit suitable for generating a first corrected signal and a second corrected signal corresponding to the detection result based on a logic state of the first clock and a logic state of the second clock; and a second logic combination unit suitable for generating a third corrected signal and a fourth corrected signal the detection result in response to the first corrected signal and the second corrected signal, wherein the first logic combination unit recombines the logic state of the first clock and the logic state of the second clock and generates the first corrected signal and the second corrected signal in a predetermined logic combination, and wherein the first logic combination unit generates the first and second corrected signals at a first logic state when the logic states of the first and second clocks are the same, while generating the first and second corrected signals at different logic states when the logic states of the first and second clocks are different.

2. The duty cycle correction circuit of claim 1, wherein the second clock is delayed in phase by approximately 180 degrees from the first clock.

3. The duty cycle correction circuit of claim 1, wherein the second logic combination unit generates the third corrected signal, which is in an inversion relationship with the first corrected signal, and the fourth corrected signal, which is in an inversion relationship with the second corrected signal.

4. The duty cycle correction circuit of claim 1, wherein the correction block includes:

a first phase correction unit suitable for generating the first corrected clock and the second corrected clock in response to the first to fourth corrected signals; and a second phase correction unit suitable for maintaining a logic state of the first corrected clock and a logic state of the second corrected clock.

5. The duty cycle correction circuit of claim 4, wherein the first phase correction unit generates the first corrected clock and the second corrected clock which are in an inversion relationship with each other in response to the first to fourth corrected signals.

6. The duty cycle correction circuit of claim 4, wherein the first phase correction unit includes:

a first driver suitable for driving an output terminal of the first corrected clock with high voltage in response to the first corrected signal;

a second driver suitable for driving the output terminal of the first corrected clock with low voltage in response to the fourth corrected signal;

a third driver suitable for driving an output terminal of the second corrected clock with high voltage in response to the second corrected signal; and a fourth driver suitable for driving the output terminal of the second corrected clock with low voltage in response to the third corrected signal.

* * * * *